United States Patent [19]
Jomura et al.

[11] Patent Number: 5,153,477
[45] Date of Patent: Oct. 6, 1992

[54] LAMINATE DISPLACEMENT DEVICE

[75] Inventors: Shigeru Jomura, Tokyo; Junichi Watanabe, Kumagaya; Takahiro Someji; Yoshiyuki Watanabe, both of Fukaya, all of Japan

[73] Assignee: Hitachi Metals, Ltd., Tokyo, Japan

[21] Appl. No.: 653,548

[22] Filed: Feb. 11, 1991

[30] Foreign Application Priority Data

Feb. 26, 1990 [JP] Japan .................................. 2-45247

[51] Int. Cl.⁵ ........................................... H01L 41/08
[52] U.S. Cl. ................................. 310/328; 310/365; 310/366
[58] Field of Search ................ 310/328, 365, 366, 358

[56] References Cited

U.S. PATENT DOCUMENTS

| | | | |
|---|---|---|---|
| 3,489,931 | 1/1970 | Teaford | 310/366 |
| 3,590,287 | 6/1971 | Berlincourt et al. | 310/366 |
| 4,564,782 | 1/1986 | Ogawa | 310/358 |
| 4,649,313 | 3/1987 | Ogawa et al. | 310/358 |
| 4,894,580 | 1/1990 | Ogawa | 310/366 X |
| 4,900,970 | 2/1990 | Ando et al. | 310/358 X |
| 4,918,350 | 4/1990 | Ando et al. | 310/358 X |
| 4,939,403 | 7/1990 | Kittaka et al. | 310/366 X |
| 5,073,740 | 12/1991 | Jomura et al. | 310/366 X |

FOREIGN PATENT DOCUMENTS

| | | |
|---|---|---|
| 92428 | 10/1983 | European Pat. Off. . |
| 92427 | 7/1985 | European Pat. Off. . |
| 58-196068 | 11/1983 | Japan . |
| 0196072 | 11/1983 | Japan .................................. 310/366 |
| 59-32040 | 8/1984 | Japan . |
| 0142780 | 6/1986 | Japan .................................. 310/366 |
| 62-62571 | 3/1987 | Japan . |
| 1-139465 | 9/1989 | Japan . |
| 8401857 | 5/1984 | PCT Int'l Appl. . |
| 1521189 | 8/1978 | United Kingdom . |
| 2232532 | 12/1990 | United Kingdom . |

*Primary Examiner*—Mark O. Budd
*Attorney, Agent, or Firm*—Sughrue, Mion, Zinn, Macpeak & Seas

[57] ABSTRACT

A laminated displacement device comprises: a laminate which is formed by alternately laminating thin plates made of an electromechanical converting material and internal electrodes made of a conductive material; and external electrodes which are provided in the side portions of the laminate and are connected to the internal electrodes. In the laminated displacement device, a plane projection area which is obtained by overlapping the internal electrodes in the laminating direction is set to be smaller than a plane projection area which is obtained by overlapping the thin plates in the laminating direction. A relation of $B/A \geq 0.5$ is satisfied between the width dimension A of a displacement portion which is formed by overlapping the projections of the internal electrodes in the laminating direction and the width dimension B of a non-displacement portion which is formed between the edge of the displacement portion and the side surface of the laminate.

3 Claims, 3 Drawing Sheets

LAMINATE DISPLACEMENT DEVICE

BACKGROUND OF THE INVENTION

The present invention relates to an electromechanical converting device which is used in an actuator, an ultrasonic motor, and the like of industrial robots and, more particularly, to the improvement of a laminated displacement device in which a plurality of thin plates made of an electromechanical converting material are laminated through internal electrodes, thereby assuring a predetermined displacement amount.

Hitherto, a laminated piezoelectric transducer which is used in a displacement device which is coupled to an output device such as a positioning mechanism of an X-Y stage, a brake, or the like uses a method whereby electrodes are provided for thin plates made of a piezoelectric ceramic material which are worked into a predetermined shape and are polarized and, thereafter, the thin plates are joined directly or through thin metal plates by an adhesive agent of the organic system. However, the laminated piezoelectric transducer which is constructed by laminating the thin plates by using the adhesive agent as mentioned above has drawbacks such that the adhesive agent layers absorb a displacement due to the vibration of the piezoelectric transducer in dependence on the use conditions, the adhesive agent deteriorates due to the environment of a high temperature or the use for a long time, and the like.

Therefore, in recent years, a laminated piezoelectric transducer of the laminated chip capacitor structure type has been put into practical use. That is, for instance, as shown in JP-B-59-32040, a paste-like piezoelectric ceramic material which is obtained by adding binders and solvents into raw material powder and kneading is formed like a thin plate having a predetermined thickness and a conductive material such as silver-palladium or the like is coated onto one or both surfaces of the thin plate, thereby forming an internal electrode. A predetermined number of such thin plates are laminated and adhered with a pressure and are, further, worked into a predetermined shape. After that, they are sintered to obtain ceramics. External electrodes are formed on both side surfaces of the laminate. The laminated piezoelectric transducer with the above construction has advantages such that an adhesive property of the joined portion between the thin plate made of the piezoelectric ceramic material and the internal electrode is excellent and the thermal characteristics are also stable, so that the laminated piezoelectric transducer can be sufficiently used even in an environment of a high temperature, a deterioration is extremely small for a long time, and the like.

What are called alternating electrode type and whole surface electrode type (for example, JP-A-58-196068) have been known as laminated piezoelectric transducers.

SUMMARY OF THE INVENTION

It is an object of the present invention to provide an economical laminated displacement device of a high durability which can prevent a migration and can prevent the occurrence of cracks and the like.

FIG. 4 is a diagram showing a laminated displacement device of what is called an alternating electrode type. In FIG. 4, reference numeral 1 denotes a thin plate made of a piezoelectric ceramic material. A laminate 5 is formed by alternately adhering positive and negative internal electrodes 2a and 2b to the thin plate 1 and laminating a plurality of such thin plates. The internal electrodes 2a and 2b are formed such that one edge portion of each of the internal electrodes is projected or exposed to the outside and are respectively connected to external electrodes 3a and 3b which extend in the laminating direction. Lead wires 6 are connected to the external electrodes 3a and 3b through solders 7.

In the above construction, when positive and negative voltages are applied to the external electrodes 3a and 3b, an electric field is generated between the internal electrodes 2a and 2b and the thin plate 1 is extended in the thickness direction by a longitudinal effect of the piezoelectric ceramic material and a displacement occurs.

FIG. 5 shows another example of the laminated piezoelectric transducer which is what is called a whole surface electrode type in which a piezoelectric displacement efficiency is improved. In FIG. 5, the same parts and components as those shown in FIG. 4 are designated by the same reference numerals. The internal electrodes 2a and 2b are formed so as to extend to the whole surface of the thin plate 1. A desired number of such thin plates 1 are laminated in a manner similar to the above. Coatings 4 made of an insulative material are formed at the edges of the internal electrodes 2a and 2b (for instance, only the internal electrodes 2b) on one side of the laminate 5 formed as mentioned above every other layer. The external electrode 3a made of a conductive material is coated onto the coatings 4. On the other hand, at the other side of the laminate 5, the coatings are formed at the edges of the internal electrodes (e.g., 2a) on which no coating 4 is formed in a manner similar to the above. The external electrode 3b is coated onto the coatings 4. The operation by the above structure is similar to that in FIG. 4.

In the laminated piezoelectric transducer with the above construction, in the case of a use state such that a displacement is obtained by continuously applying a high DC voltage across the electrodes as in the case of an electronic part, if a material of the silver system is used as an electrode material, there is a problem such that a so called migration occurs in the high humidity atmosphere and an insulative breakdown finally occurs. In other words, although Ag constructing the electrodes is an element which is easily oxidized, it is ionized (Ag+) in the high humidity atmosphere. The Ag ions are attracted to the negative electrode by the applied voltage and are deposited on the negative electrode side. Such a deposition grows like a dendritic growth with the elapse of time, thereby reducing an insulative resistance between the electrodes and finally shortcircuiting. A method of forming the electrodes by a noble metal material having a high melting point such as Pt or Pd is also considered as means for preventing such a migration. However, such a method is not unpreferable because of an increase in costs although the performance is improved. There has also been proposed a method whereby the exposed portion of the internal electrode made of a material of the silver system is covered by a film made of a metal having migration characteristics smaller than those of silver (refer to, for instance, JP-A-62-62571). However, the work to cover the exposed portions after a laminate was formed is extremely complicated. The exposed portions cannot always be completely covered by the metal film. For instance, there is a case where insertion of external moisture is permitted through pin holes or the like. The above method is still unsatisfactory from a viewpoint of reliability. In addition to the above methods, for instance, a coating method using a coating made of a resin material, a method of sealing the device into a vessel made of a metal, and the like have been tried as methods of preventing the insertion of the moisture in the high humidity atmosphere. However, even if the exposed portions are coated by a coating made of a resin material, not only is a non-permeability of the coating not always perfect but also there is a case where microcracks occur due to the operation of the device or a slight gap occurs in the boundary portion between the coating and the lead wire and moisture enters through such microcracks or gap. On the other hand, in the case where the device is sealed into the vessel made of a metal, there are drawbacks such that not only a displacement amount of the device is suppressed but also the whole volume is increased and, further, the costs rise. All of the above conventional constructions have problems such that it is difficult to perfectly prevent the migration and the life of the device is remarkably short. In the recent optical applications or application field such as a semiconductor manufacturing apparatus or the like, even if a displacement amount is small, the requirements for the improvement of the moisture proof and durability are further severe. The conventional structures cannot satisfy those severe requirements.

In the field of the ceramic capacitor, there has been disclosed a structure such that the internal electrodes are sealed in the laminate and the outside surfaces of the laminate are covered by the external electrode (for instance, "Magazine of the Institute of Electronics, Information and Communication Engineers of Japan", Separate Volume, Vol. 70, No. 1, pp. 109-112, January, 1987). However, in such a ceramic capacitor, since a displacement in the laminating direction is equal to almost zero, no consideration is paid with respect to the generation of cracks which are caused by a stress in the boundary portion between the displacement portion and the non-displacement portion in the laminated displacement device.

It is an object of the invention to solve the problems in the above conventional techniques and to provide a laminated displacement device having a high durability which can perfectly prevent the migration without raising the costs, and cracks and the like are not generated.

To accomplish the above object, according to the invention, there is provided a laminated displacement device in which a plurality of thin plates made of an electromechanical converting material and a plurality of internal electrodes made of a conductive material are alternately laminated to form a laminate and a pair of external electrodes, which are connected with the internal electrodes at every other layer are provided on the side surfaces of the laminate, wherein the device uses technical means such that a plane projection area of the internal electrodes is set to be smaller than a plane projection area of the thin plates and only the connecting portions of the internal electrodes with the external electrode are exposed to the side surface of the laminate and are formed so as to satisfy a relation of $B/A \geq 0.5$, where, A: width dimension of a displacement portion which is formed by overlapping the projections of the internal electrodes in the laminating direction, B: width dimension of a non-displacement portion which is formed between the edge of the displacement portion and the side surface of the laminate.

According to the invention, the connecting portions of the internal electrodes with the external electrode can be formed on the opposite side surfaces, the same side surface, or the adjacent side surfaces of the laminate.

With the above construction, the internal electrodes made of, for instance, a material of the silver system are completely sealed in the laminate and the contact with the external atmosphere can be shut out, so that the insertion of the moisture contained in the external atmosphere into the laminate can be blocked.

On the other hand, since the width dimension of the non-displacement portion which is formed near the side portion of the laminate is set to a value which is equal to or larger than half of the width dimension of the displacement portion is assured and the device can sufficiently cope with a stress which is generated in the boundary portion between the non-displacement portion and the displacement portion.

Since the invention is constructed and operates as mentioned above, the internal electrodes can be perfectly sealed, the migration can be completely prevented, the moisture proofness can be remarkably improved, and the device can sufficiently effect the function even in the high humidity environment. In addition, since the intensity of the non-displacement portion can be assured, the device is suitable particularly for optical applications and an application field of a semiconductor manufacturing apparatus or the like in which high durability and reliability are required even when a displacement amount is small. There is an effect such that an application range can be enlarged.

DESCRIPTION OF THE PREFERRED EMBODIMENT

Figure 1A:
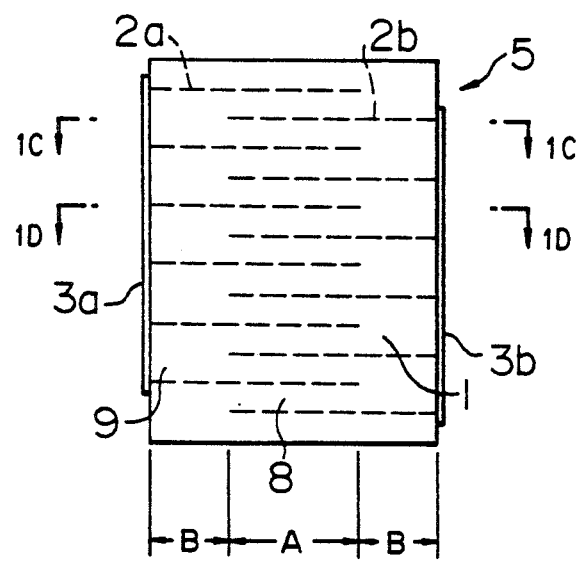
FIG. 1A is a diagram showing a main section of an embodiment of the invention.
Figure 1B:
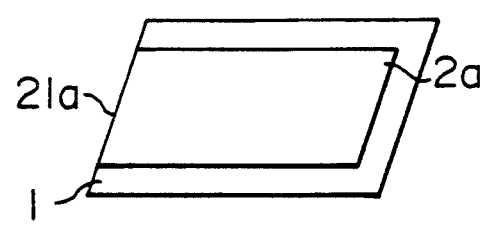
FIG. 1B is a cross sectional view taken along the line 1C—1C in FIG. 1A.
Figure 1C:
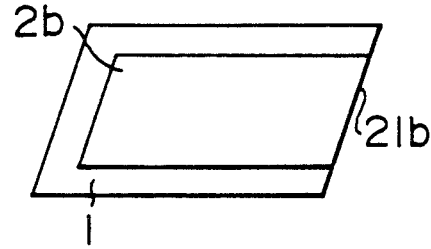
FIG. 1C is a cross sectional view taken along the line 1D—1D in FIG. 1A.
Figure 4:
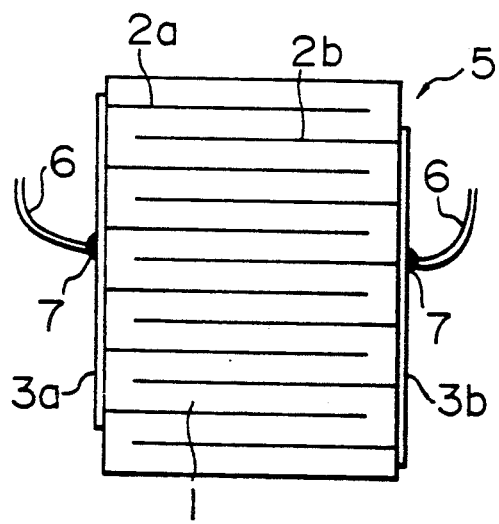
FIG. 4 is a schematic diagram showing an example of a laminated displacement device of the alternating electrode type.
Figure 5:
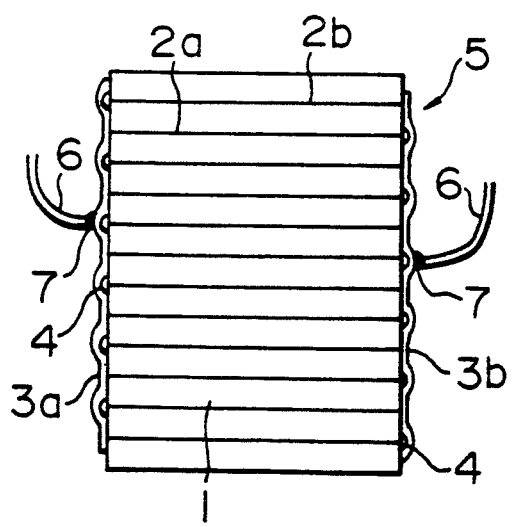
FIG. 5 is a schematic diagram showing an example of a laminated displacement device of the whole surface electrode type.

FIG. 1A is a side elevational view of a main section showing an embodiment of the invention. FIGS. 1B and 1C are cross sectional views taken along the lines 1C—1C and 1D—1D in FIG. 1A, respectively. In the diagrams, the same parts and components as those shown in FIGS. 4 and 5 are designated by the same reference numerals. In the diagrams, the thin plates 1 are formed, for example, in the following manner. First, a raw material comprising PbO of 62.36 weight %, $SrCO_3$ of 4.54 weight %, $TiO_2$ of 11.38 weight %, $ZrO_2$ of 20.60 weight %, and $Sb_2O_3$ of 1.12 weight % is mixed by a ball mill for 24 hours. After that, it is calcined at 800° C. for one hour. After the calcined powder was ground, polyvinyl butyral is added to the calcined powder. The resultant powder is dispersed into trichlene to thereby form a slurry. The resultant mixed material is formed to obtain a sheet-like thin plate having a thickness of 100 μm by a doctor-blade method. Then, a platinum conductive paste or a silver-palladium paste to form the internal electrodes 2a and 2b is screen printed on the surface of the thin plate 1. In this case, as shown in FIGS. 1B and 1C, the internal electrodes 2a and 2b are formed in a manner such that plane projection areas are smaller than a plane projection area of the thin plate 1. The connecting portions 21a and 21b which connect with the external electrodes 3a and 3b (refer to FIG. 1A) are formed so as to extend the edges of the thin plates 1. A plurality of, e.g., 100 thin plates 1 having the internal electrodes 2a and 2b formed as mentioned above are alternately laminated and adhered with a pressure. After that, they are formed into a laminate with a predetermined dimensional shape and a debinding process is executed at 500° C. Subsequently, the laminate is sintered in oxygen at a temperature from 1050° C. to 1200° C. for 1 to 5 hours and is formed into the laminate 5 with predetermined dimensions. Dimensions of the laminate 5 are set to, for instance, $3 \times 3 \times 10$ 1 (mm) or $50 \times 50 \times 10$ 1 (mm). Then, the external electrodes 3a and 3b are formed. In this case, it is desirable to form the external electrodes 3a and 3b over the whole width dimensions of the connecting portions 21a and 21b of the internal electrodes 2a and 2b. In the side portions of the laminate 5 formed as mentioned above, only the thin plates 1 and external electrodes 3a and 3b are exposed and the internal electrodes 2a and 2b are completely sealed in the laminate. In FIG. 1A, A denotes a width dimension of a displacement portion 8 which is formed such that the projections of the internal electrodes 2a and 2b are overlapped in the laminating direction. B denotes a width dimension of a non-displacement portion 9 which is formed between the edge of the displacement portion 8 and the side surface of the laminate 5.

With respect to the laminate 5 formed as mentioned above, the value of B/A, the displacement amount, and the non defective ratio (survival ratio) were measured and evaluated. In the above case, the width dimension A of the displacement portion 8 in FIG. 1A was set to 10 mm, 5 mm, and 3 mm, respectively, and the width dimension B of the non-displacement portion 9 was changed with respect to those values of the width dimension A, respectively. The non defective ratio (survival ratio) denotes a ratio of the number of remaining good laminates 5 in the case where up to twenty laminates 5 were formed with respect to each of the above width dimensions A and B, an applying voltage in a range from 0 to 150 V was on/off controlled at a frequency of 4 Hz, the on/off operations were performed $5 \times 10^6$ times, and after that, cracks due to the stress of the boundary portion between the displacement portion 8 and the non-displacement portion 9 were not generated.

Figure 2:
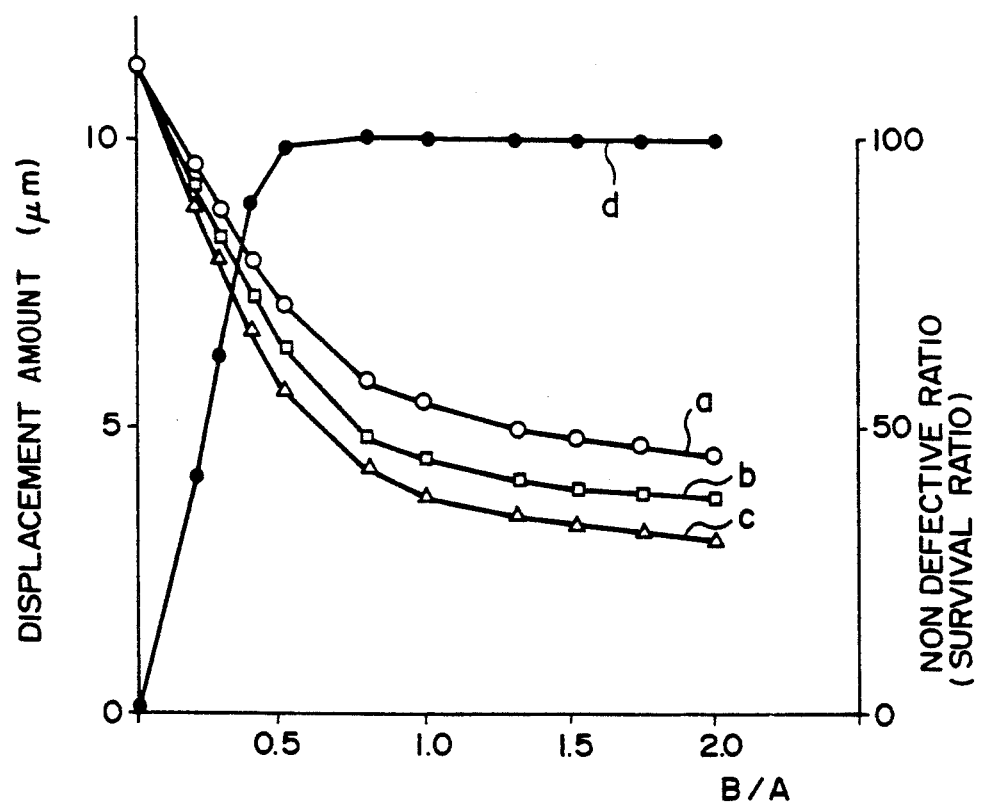
FIG. 2 is a diagram showing the relations among the value of B/A, the displacement amount, and the non defective ratio (survival ratio)

FIG. 2 is a diagram showing the relations among the value of B/A, the displacement amount, and the non defective ratio (survival ratio). In the diagram, curves a, b, and c show displacement amounts corresponding to the laminates in which the width dimensions A of the displacement portions are set to 10 mm, 5 mm, and 3 mm. A curve d shows a non-defective ratio (survival ratio). As will be obvious from FIG. 2, the displacement amounts gradually decrease with an increase in B/A as shown by the curves a, b, and c. As will be obviously understood from FIG. 1A as well, this is because the displacement amount of the displacement portion 8 is limited as a ratio of the non-displacement portion 9 increases. When B/A=0, the device is of the whole surface electrode type (refer to FIG. 5) and, for instance, a resin coating of the polyimide system is provided to prevent that the internal electrodes 2a and 2b are exposed to the side portions of the laminate 5. As shown by the curve d, in a region where B/A is less than 0.5, the width dimension B of the non-displacement portion 9 shown in FIG. 1A is small. Therefore, an intensity which can endure the stress which is generated in the boundary portion between the displacement portion 8 and the nondisplacement portion 9 lacks and a phenomenon such that the thin plate 1 is broken frequently occurs and it has been found that the non-defective ratio (survival ratio) remarkably deteriorates. Therefore, in optical applications and the application field of the semiconductor manufacturing apparatus or the like, it is desirable to set B/A to 0.5 or more in order to rather improve the durability and reliability in consideration of a point that a displacement amount which is required as a laminated displacement device is equal to or less than 10 μm.

Figure 3A:
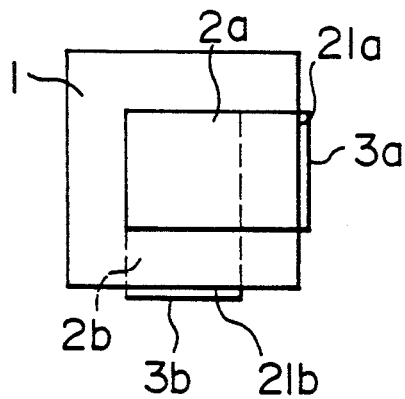
FIGS. 3A to 3G are plan views showing examples of plane projection outline shapes of internal electrodes according to the invention, respectively.
Figure 3B:
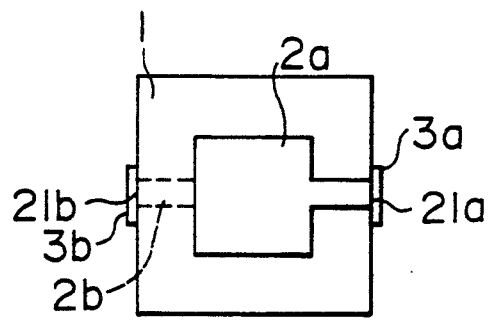
Figure 3C:
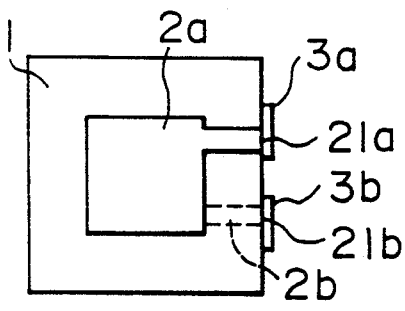
Figure 3D:
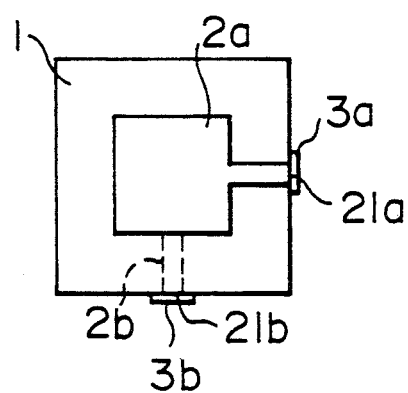
Figure 3E:
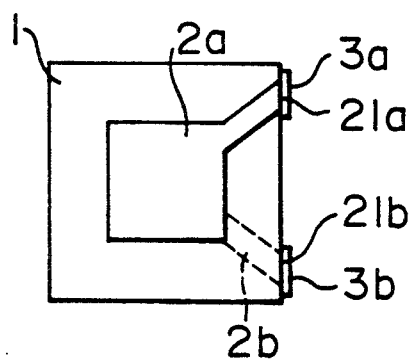
Figure 3F:
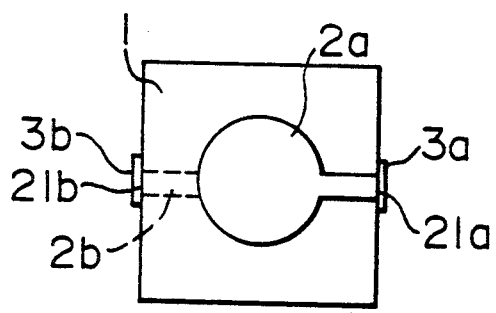
Figure 3G:
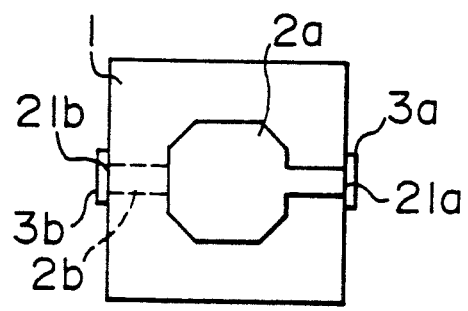

FIGS. 3A to 3G are plan views showing examples of plane projection outline shapes of the internal electrodes according to the invention, respectively. In the diagrams, the same parts and components as those shown in FIGS. 1A to 1C are designated by the same reference numerals. FIG. 3A shows an example in which the connecting portions 21a and 21b of the internal electrodes 2a and 2b are exposed to the adjacent side surfaces of the thin plates 1. FIGS. 3B to 3G show examples in which the connecting portions 21a and 21b are formed so that the width dimensions are smaller than the width dimensions of the internal electrodes 2a and 2b. With the above structures, the width dimensions of the external electrodes 3a and 3b can be reduced. FIGS. 3C and 3E show the cases where the connecting portions 21a and 21b are exposed to the same side surface of the thin plates 1. With the above structures, lead wires (not shown) which are connected to the external electrodes 3a and 3b can be convenient to handle. By forming the device as shown in FIG. 3E, creeping distances between the connecting portions 21a and 21b and between the external electrodes 3a and 3b can be set to large values. FIGS. 3F and 3G show the cases where the plane projection outline shapes of the internal electrodes 2a and 2b are set to a circle and an octagon, respectively.

Although the embodiment has been described with respect to the case where the plane projection outline shape of each of the thin plates constructing the laminate is set to a square, it can be set to any other geometrical shape such as rectangle, polygon, circle, or ellipse. The same shall also apply to the internal electrodes. In addition, although the embodiment has been described with respect to an example in which the screen printing method has been used as means for forming the internal and external electrodes, the invention is not limited to such an example. The similar effect can be also obtained by using other means such as plating, evaporation depositing, coating, or the like. Further, although the embodiment has been described with respect to the case where a piezoelectric material has been used as an electromechanical converting material, an effect which is almost similar to that mentioned above can be also obtained by using an electrostrictive material having features such that there is no need to polarize, the displacement amount is large, a hysteresis is small, and the like because the Curie temperature is lower than the room temperature. As such an electrostrictive material, for instance, $(Pb_{0.916}La_{0.084})(Zr_{0.65}Ti_{0.35})_{0.979}O_3$, $(Pb_{0.85}Sr_{0.15})(Zr_{0.51}Ti_{0.34}Zn_{0.0125}Ni_{0.0375}Nb_{0.10})O_3$, $(Pb_{0.85}Sr_{0.15})(Zr_{0.50}Ti_{0.30}Zn_{0.05}Ni_{0.05}Nb_{0.10})O_3$ or the like can be used.

We claim:

1. A laminated displacement actuator coupled to move an output device and which operates at a high voltage no greater than 150 volts in which a plurality of thin plates made of an electromechanical converting material and a plurality of internal electrodes made of a conductive material are alternatively laminated and a laminate is formed and a pair of external electrodes to be connected to connecting portions of said internal electrodes at every other layer are formed on side surfaces of said laminate, wherein a plane projection area of the internal electrodes is set to be smaller than a plane projection area of said thin plates, and only the connecting portions which are connected with the external electrodes are exposed to the side surfaces of the laminate, so as to satisfy a relation of $B/A \geq 0.5$, where A is defined as a width dimension of a displacement portion which is formed by overlapping projections of the internal electrodes in the laminating direction, and B is defined as a width dimension of a non-displacement portion which is formed between an edge of the displacement portion and the side surface of the laminate.

2. The laminated displacement actuator according to claim 1, wherein the connecting portions with the external electrodes are formed on the opposite side surfaces, the same side surface, or the adjacent side surfaces of the laminate.

3. A laminated displacement actuator coupled to move an output device and which operates at a high voltage no greater than 150 volts and comprising:

thin plates which are made of an electromechanical converting material and form a laminate;

a set of internal electrodes which are alternately adhered to the thin plates so as to sandwich them and form the laminate together with the thin plates and in which one of said internal electrodes is formed so as to be exposed to one of a plurality of side portions of the laminate and the other internal electrode is formed so as to be exposed to another of the side portions of the laminate; and external electrodes which are respectively provided for said side portions and are respectively connected to the internal electrodes, wherein a plane projection area which is formed by overlapping the internal electrodes in a laminating direction is set to be smaller than a plane projection area which is formed by overlapping the thin plates in a laminating direction and a relation of $B/A \geq 0.5$ is satisfied, where A is defined as a width dimension of a displacement portion which is formed by overlapping projections of both of said set of internal electrodes in the laminating direction, and B is defined as a width dimension of a non-displacement portion which is sandwiched between an edge of said displacement portion and a side portion of the laminate.

* * * * *